United States Patent
Yang et al.

(10) Patent No.: US 8,193,592 B2
(45) Date of Patent: Jun. 5, 2012

(54) MOSFET WITH ASYMMETRICAL EXTENSION IMPLANT

(75) Inventors: Frank Bin Yang, Mahwah, NJ (US); Andrew M. Waite, Hopewell Junction, NY (US); Scott Luning, Poughkeepsie, NY (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 12/904,662

(22) Filed: Oct. 14, 2010

(65) Prior Publication Data

US 2011/0024841 A1  Feb. 3, 2011

Related U.S. Application Data

(62) Division of application No. 12/121,387, filed on May 15, 2008, now Pat. No. 7,829,401.

(51) Int. Cl.
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl. ............... 257/401; 257/288; 257/E21.092; 257/E21.32; 257/E21.4; 257/E21.127; 257/E21.248; 257/E21.421

(58) Field of Classification Search .............. 257/288, 257/341, 350, 347, 401, E21.092, 32, 4, 127, 257/248, 421, E21.32, E21.4, E21.127, E21.248, 257/E21.421
See application file for complete search history.

(56) References Cited

U.S. PATENT DOCUMENTS

| 5,308,780 | A | 5/1994 | Chou et al. |
| 5,510,279 | A | 4/1996 | Chien et al. |
| 5,935,867 | A | 8/1999 | Alvis et al. |
| 5,960,291 | A | 9/1999 | Krivokapic |
| 6,040,208 | A | 3/2000 | Honeycutt et al. |
| 6,130,134 | A | 10/2000 | Chen |
| 6,140,186 | A | 10/2000 | Lin et al. |
| 6,242,329 | B1 | 6/2001 | Huster et al. |
| 7,148,559 | B2 | 12/2006 | Chan et al. |
| 7,482,216 | B2 | 1/2009 | Chan et al. |
| 7,829,401 | B2 * | 11/2010 | Yang et al. ............ 438/197 |
| 2006/0130246 | A1 | 6/2006 | Molenda et al. |

* cited by examiner

*Primary Examiner* — David Nhu
(74) *Attorney, Agent, or Firm* — Ingrassia Fisher & Lorenz, P.C.

(57) ABSTRACT

A method for fabricating a MOSFET (e.g., a PMOS FET) includes providing a semiconductor substrate having surface characterized by a (110) surface orientation or (110) sidewall surfaces, forming a gate structure on the surface, and forming a source extension and a drain extension in the semiconductor substrate asymmetrically positioned with respect to the gate structure. An ion implantation process is performed at a non-zero tilt angle. At least one spacer and the gate electrode mask a portion of the surface during the ion implantation process such that the source extension and drain extension are asymmetrically positioned with respect to the gate structure by an asymmetry measure.

20 Claims, 7 Drawing Sheets

MOSFET WITH ASYMMETRICAL EXTENSION IMPLANT

CROSS-REFERENCE TO RELATED APPLICATIONS

This application claims priority to, and is a divisional of, U.S. patent application Ser. No. 12/121,387, filed May 15, 2008, now U.S. Pat. No. 7,829,401.

FIELD OF THE INVENTION

The present invention generally relates to MOS structures and methods for fabricating MOS structures, and more particularly relates to improved extension implant configurations for use in (110) channel p-type MOSFET devices, such as planar (110) pMOSFET, FinFET and Tri-gate FETs employing (110) side wall channels.

BACKGROUND OF THE INVENTION

There has been an increased interest in metal-oxide-semiconductor field-effect transistors (MOSFETs) incorporating substrates having a (110) surface orientation, particularly with respect to PMOS devices. This interest is due to the increased (approximately 2×) hole mobility advantage as compared to traditional (100) devices as well as the ever-increasing importance of (110) channels in advanced FET structures, such as FinFETs, Tri-gate FETs, and the like.

Known (110) pMOSFET (pMOS, or pFET) devices, however, are unsatisfactory in a number of respects. For example, such devices exhibit an unexpectedly high source-drain external resistance ($R_{ext}$). This resistance penalty substantially limits drive current, in some cases by 20%, and thus presents a significant barrier to achieving high drive current and high performance in (110) PMOS devices.

There is therefore a long-felt need for MOSFET structures that can leverage the higher hole mobility advantages of (110) substrates while avoiding the increased external resistance associated therewith. These and other desirable features and characteristics of the present invention will become apparent from the subsequent detailed description of the invention and the appended claims, taken in conjunction with the accompanying drawings and this background of the invention.

BRIEF SUMMARY OF THE INVENTION

The present invention relates to a MOSFET structure with asymmetrically implanted source and drain extension regions formed within a substrate (e.g., a Si or SiGe semiconductor-on-insulator substrate) having a (110) surface orientation. An unexpected result of this method is that the external resistance ($R_{ext}$) of the structure is dramatically reduced.

A method for fabricating a MOSFET (e.g., a PMOS FET) in accordance with one embodiment includes providing a semiconductor substrate having surface characterized by a (110) surface orientation, forming a gate structure on the surface, and forming a source extension and a drain extension in the semiconductor substrate asymmetrically positioned with respect to the gate structure.

In accordance with a further embodiment, the method includes performing an ion implantation process at a non-zero tilt angle, wherein at least one spacer and the gate electrode mask a portion of the surface during the ion implantation process such that the source extension and drain extension are asymmetrically positioned with respect to the gate structure by an asymmetry measure.

BRIEF DESCRIPTION OF THE DRAWINGS

The present invention will hereinafter be described in conjunction with the following drawing figures, wherein like numerals denote like elements, and wherein.

DETAILED DESCRIPTION OF THE INVENTION

Figure 1:
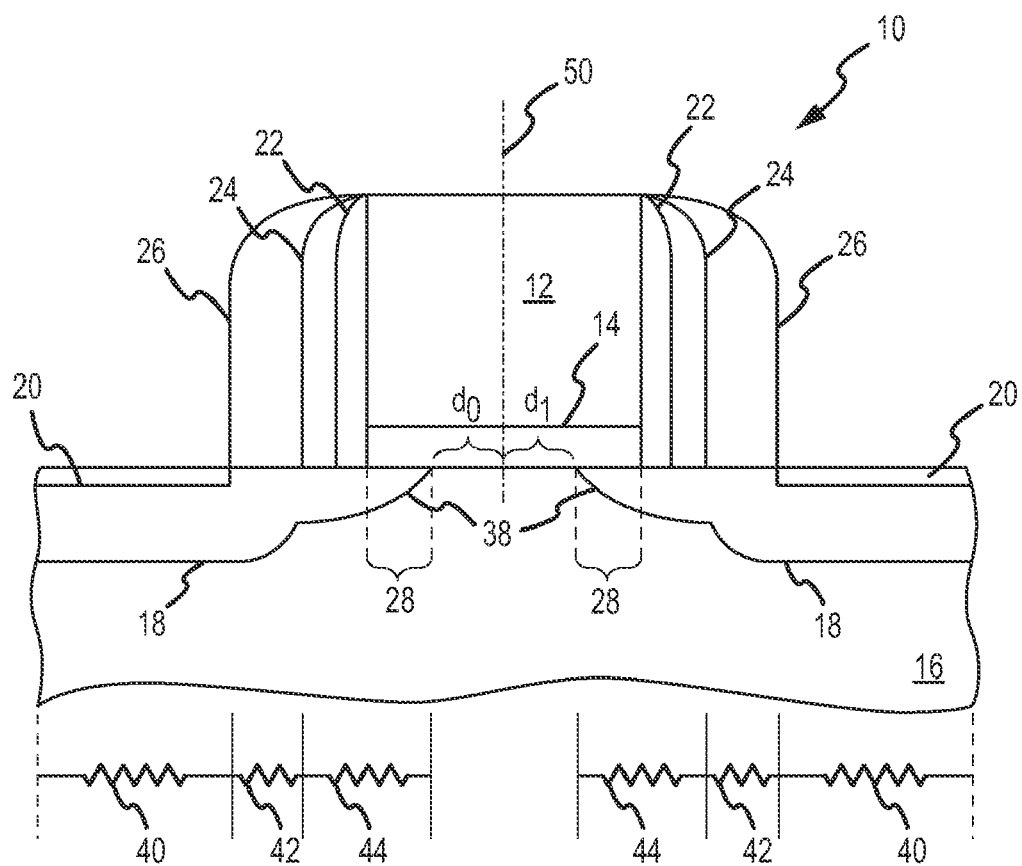
FIG. 1 is a conceptual cross-sectional view of an exemplary prior art MOSFET structure useful in describing the present invention.

In general, the present invention relates to (110) channel pFET structures incorporating asymmetrically positioned drain and source extensions that greatly reduce $R_{ext}$. In this regard, the following detailed description is merely exemplary in nature and is not intended to limit the range of possible embodiments and applications. Furthermore, there is no intention to be bound by any theory presented in the preceding background or the following detailed description.

For simplicity and clarity of illustration, the drawing figures depict the general structure and/or manner of construction of the various MOSFET embodiments. Elements in the drawings figures are not necessarily drawn to scale: the dimensions of some features may be exaggerated relative to other elements to assist understanding of the exemplary embodiments. In the interest of conciseness, conventional techniques, structures, and principles known by those skilled in the art may not be described herein, including, for example, standard semiconductor processing techniques, fundamental principles of semiconductor devices, and basic operational principles of FETs.

Referring now to the conceptual isometric overview depicted in FIG. 1, a conventional MOSFET structure 10 includes a gate electrode 12 and gate insulator 14 (collectively referred to as a "gate structure"), both of which are disposed on a semiconductor substrate 16. Shallow source and drain extensions (or simply "extensions") 38, as well as deep source and drain regions 18, are formed within the semiconductor substrate 16. Each pair of deep and shallow regions are referred to as the "source region" and "drain region" collectively. Conductive contacts 20 (e.g., comprising metal silicide or the like) are disposed on the source/drain regions 18.

Substrate 16 may include any combination of semiconductor materials, including, for example, Si, Ge, GaAs, SiGe, and the like. In one embodiment, described in further detail below, substrate 16 includes a semiconductor-on-insulator layer overlying a buried oxide layer.

Adjacent to gate electrode 12, MOSFET 10 includes a re-oxidation (or "reox") sidewall spacer 22, an offset spacer 24, and a final spacer 26. Reox spacer 22, which may have a thickness, for example, of about 3.0-4.0 nm, is typically formed by subjecting gate electrode 12 to a high temperature in an oxidizing ambient environment. Offset spacer 24, having a thickness of about 10.0-20.0 nm, is used in conjunction with re-oxidation spacer 22 and gate electrode 12 as an ion implantation mask for formation of source and drain extensions 38.

Final spacer 26, which typically comprises SiN, is disposed adjacent offset spacer 24, and is used as an ion implantation mask for formation of deep source and drain regions 18. Final spacer 26 also separates conductive contact 20 from gate electrode 12 to prevent an electrical shorting of the gate to either the source or drain regions 18.

As shown in FIG. 1, the source and drain extensions 38 of conventional MOSFETs are substantially symmetrical with respect to the centerline 50 of gate electrode 12. Thus, the indicated distances $d_1$ and $d_2$ between centerline 50 and the edges or inner extrema of extensions 38 are substantially equal.

In accordance with the present invention, and as described in further detail below, source and drain extensions 38 are disposed asymmetrically with respect to centerline 50 of gate electrode 12. Stated another way, the distances $d_1$ and $d_2$ are substantially unequal. Stated yet another way, extensions 38 are together positioned laterally by an asymmetry measure $d_o$ (not shown in FIG. 1) with respect to centerline 50 of gate electrode 12.

Figure 3:
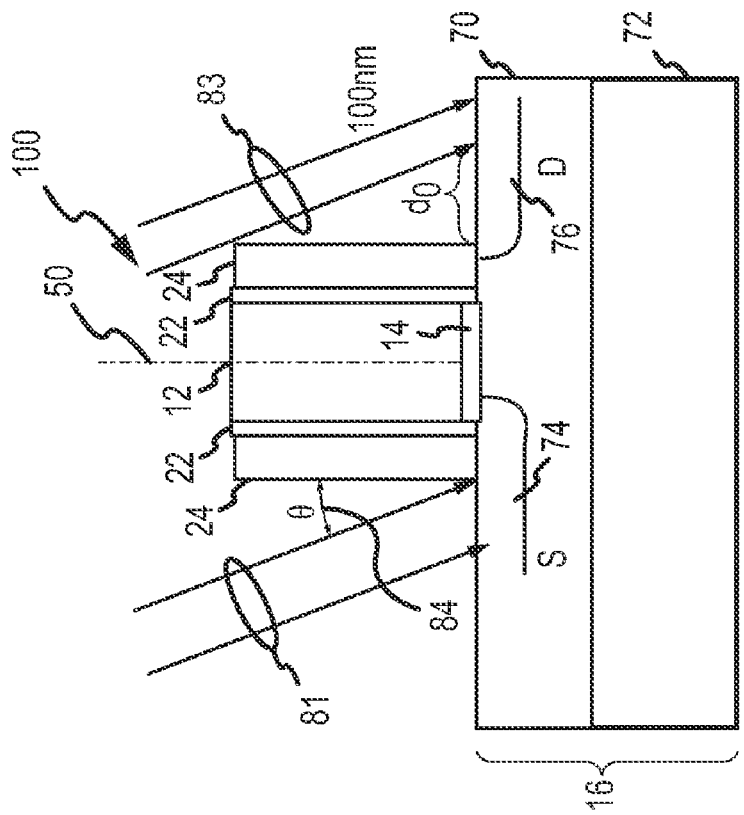
FIG. 3 is a simplified cross-sectional view showing an asymmetric implantation of source and drain extensions in accordance with one embodiment of the present invention.
Figure 2:
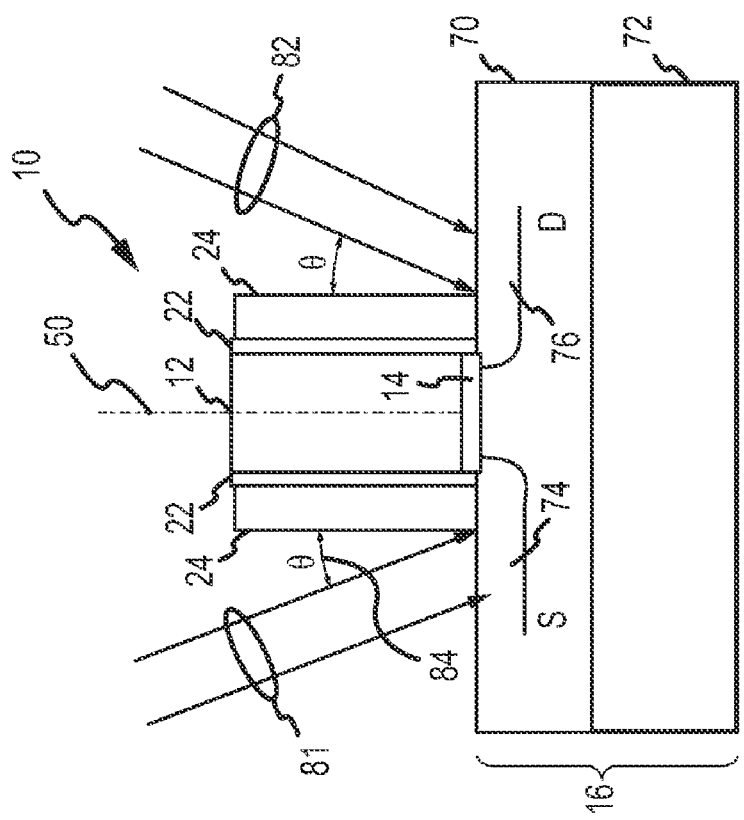
FIG. 2 is a simplified cross-sectional view showing conventional symmetric implantation of source and drain extensions.
Figure 4:
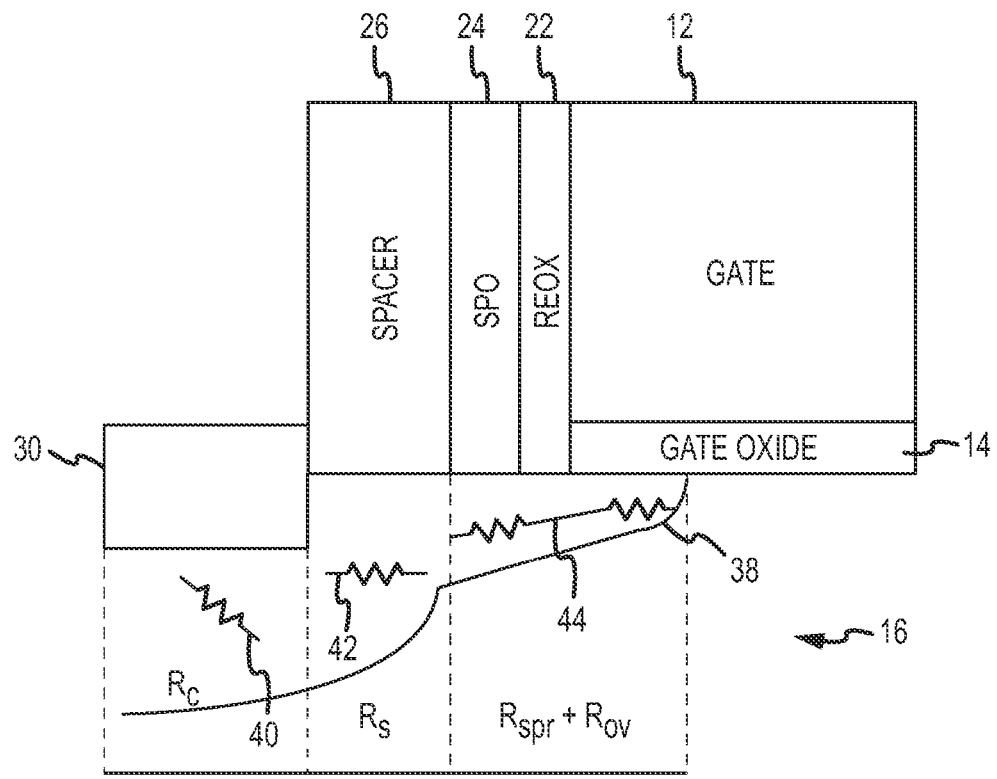
FIG. 4 is a conceptual cross-sectional view of an exemplary MOSFET structure, showing various components of its external resistance, $R_{ext}$.

More particularly, FIGS. 2-4 depict the extension ion implantation process in a conventional MOSFET structure 10 (FIG. 2) and a MOSFET structure 100 in accordance with the present invention (FIG. 3). Both structures are illustrated as formed on or within a substrate 16 comprising a semiconductor-on-insulator (SOI) layer 70 and a buried oxide (BOX) layer 72; however, in both cases either BOX or a bulk semiconductor could be used. The ion implantation step may be used to implant a p-type impurity or n-type impurity, as is known in the art, depending upon whether MOSFET structure 10 is an NMOS or PMOS device.

As shown, implanted extension regions 74 and 76 (corresponding to the source and drain, respectively) are formed symmetrically with respect to gate electrode 12 via implant directions 81 and 82 that have respective directions characterized by a symmetrical angle with respect to centerline 50 (i.e., "tilt angles" 84, designated as "θ"). This may be achieved in a variety of ways. For example, implant directions 81 and 82 may have a zero tilt angle 84 with respect to an axis perpendicular to a surface of substrate 16, or they may have a constant tilt angle 84 (e.g., 0-30 degrees) wherein substrate 16 is rotated four times, or they may have a constant tilt angle 84 wherein substrate 16 is rotated two times.

In contrast, referring to FIG. 3, a MOSFET 100 in accordance with the present invention is formed using a single angled implant direction (81, 83) on both sides of centerline 50, without rotating substrate 16 during processing. In this way, reox sidewall spacer 22, offset spacer 24, and gate electrode 12 effectively mask the incoming ion implantation along direction 83 forming a "shadow" region extending along substrate 16 by a distance equal to a asymmetry measure $d_0$ (86). Asymmetry measure 86, which in one example ranges between about 10 and 20 nm, may extend toward the drain side extension region (76) (as illustrated) or the source side extension region (74) (not illustrated).

Asymmetry measure 86 is a function of tilt angle 84 as well as the height of offset spacer 24, gate electrode 12, and any other structures masking the incident ion implantation. The tilt angle 84 may thus be selected in accordance with the desired level of asymmetry for a given geometry. In one embodiment, tilt angle 84 is between approximately 10-15 degrees. In an exemplary embodiment having a tilt angle of about 10 degrees, and a 100 nm gate electrode height, an asymmetry measure of about 18 nm is produced.

Asymmetric extension regions 74 and 76 ultimately lead (during further processing) to the formation of asymmetrical extensions 38 (i.e., $d_1 \neq d_2$ in FIG. 1) as well as a greater overlap by gate oxide 14 of extensions 38 on one side with respect to the other.

The structure resulting from asymmetrical extensions 38, particularly with respect to embodiments comprising a substrate 16 having a (110) surface orientation (and/or a (110) sidewall surface), can significantly reduce the external resistance of (110) pMOSFET 10. In this regard, referring now to the conceptual cross-section shown in FIG. 4 along with FIG. 1, the external resistance of MOS transistor 10 can be expressed as:

$$R_{ext} 2R_{SD} = 2(R_c + R_s + R_{spr} + R_{ov},$$

where $R_{SD}$ is the resistance from the conductive source and drain contacts 20 to the MOS transistor channel, including that portion of the source or drain underlying the gate oxide 14. $R_c$ 40 is the contact resistance from the conductive contact 20 to the region of the semiconductor substrate below the conductive contact 20, and $R_s$ 42 is the resistance of the semiconductor substrate 16 below final spacer 26. The resistance within extensions 38, i.e., the region of semiconductor substrate 16 below offset spacer 24, reox sidewall spacer 22, and an overlap region 28 (FIG. 1), is designated $R_{spr} + R_{ov}$ 44.

This invention has demonstrated that, with asymmetric extension implants, (110) pMOS Rext response to the asymmetric extension implants is substantially different from the conventional wisdom and expectations given the behavior of (100) pMOS. The (110) pMOS Rext is significantly reduced, a phenomenon beyond that predicted by conventional asymmetric device theory. An unexpected result has been that structures in accordance with the present invention greatly reduce the external resistance $R_{ext}$ of (110) PMOS devices, in some cases by more than 200 ohm·um, allowing exceedingly high drive currents of up to 1000 uA/um. In this regard, FIGS. 5-10, which will now be described, present experimental results associated with various embodiments, none of which is intended to limit the range of structures and applications encompassed by the present invention.

Figure 5:
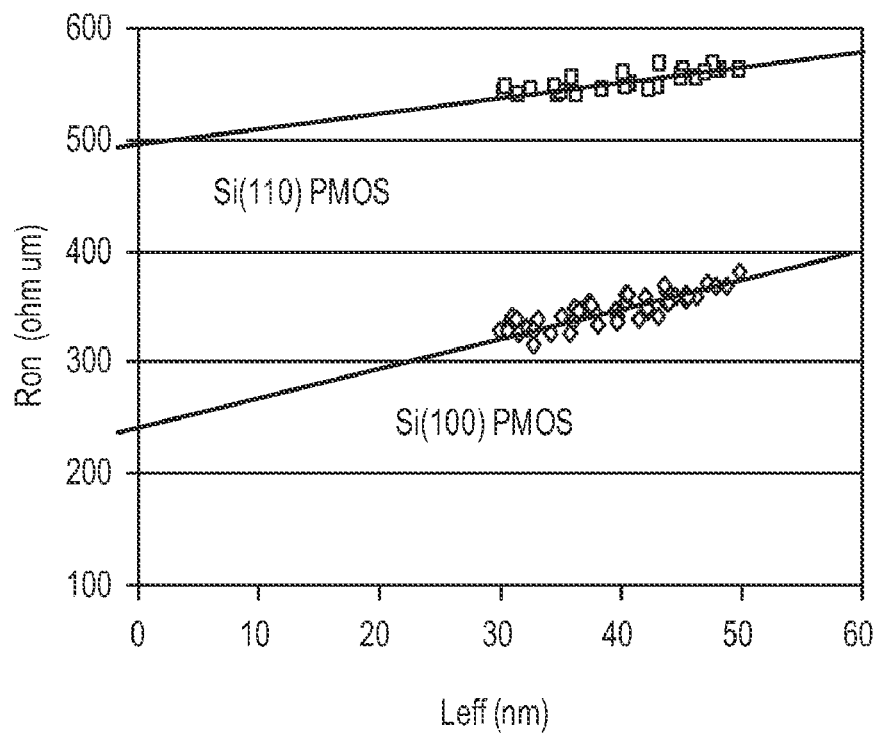
FIG. 5 is a plot of empirical results showing $R_{on}$ vs. $L_{eff}$ for exemplary (110) and (100) PMOS devices fabricated using a conventional CMOS process that is optimized for conventional (100) pMOS.
Figure 6:
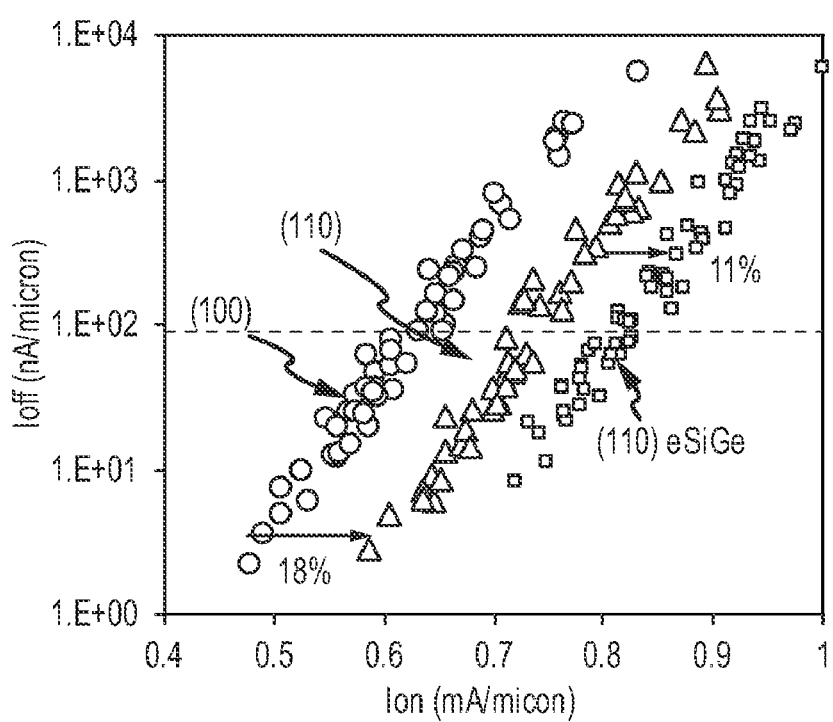
FIG. 6 is a plot of empirical results showing $I_{off}$ vs. $I_{on}$ for exemplary (110) and (100) PMOS devices

As mentioned previously, conventional fabrication of (110) MOS structures results in unsatisfactorily high on resistance. FIG. 5, for example, is a plot of empirical results showing $R_{on}$ vs. $L_{eff}$ for exemplary (110) and (100) PMOS devices, and FIG. 6 is a plot of empirical results showing $I_{off}$ vs. $I_{on}$ (drive current) for exemplary (110) and (100) PMOS devices.

As shown in FIG. 5, using conventional CMOS fabrication processes, the $R_{ext}$ of (110) eSiGe (embedded SiGe) PMOS is as high as approximately 500 ohm·um, about 250 ohm·um higher than that of (100) eSiGe PMOS. In the manufacture of eSiGe structures, a cavity is created in the active area of the PFET device following definition of the gate structure, spacer formation, and dopant implantation. The cavity is then filled with epitaxially grown SiGe material, which may be in-situ doped with a material such as boron and the like. The use of eSiGe offers some measure of improvement over standard Si devices, as shown in FIG. 6. Without eSiGe, (110) PMOS showed only 18% $I_{on}$ gain over (100) PMOS. For (110) PMOS, only about an 11% eSiGe benefit was observed. The lower-than-expected Ion benefits shown in FIG. 6 are due to the high (110) pMOS Rext resulting from the conventional (100) CMOS fabrication process.

Figure 7:
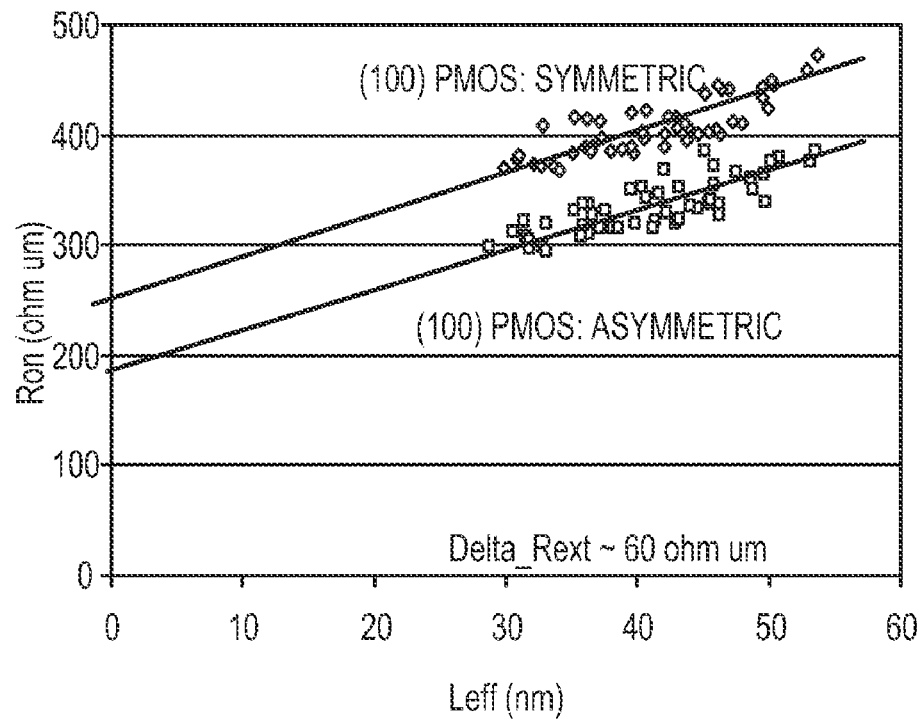
FIG. 7 is a plot of empirical results showing $R_{on}$ vs. $L_{eff}$ for exemplary (100) PMOS devices with either symmetric or asymmetric extension.
Figure 9:
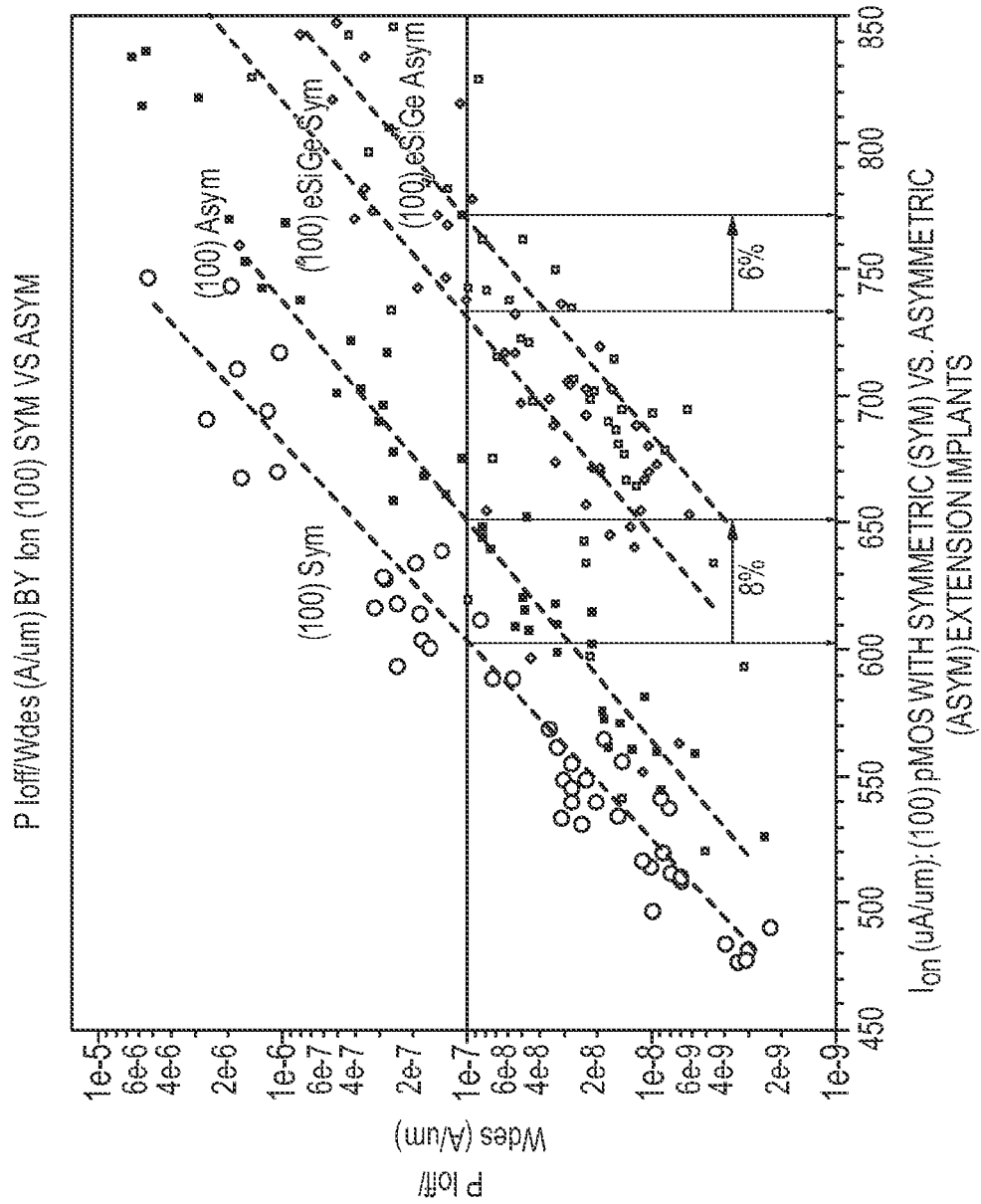
FIG. 9 is a $I_{off}$ vs. $I_{on}$ plot of empirical results showing the effect of asymmetrical extension implant on (100) pMOS with or without eSiGe.

FIG. 7 and FIG. 9 are plots of empirical results showing Rext and $I_{on}$ enhancement due to asymmetrical extension implant for exemplary (100) PMOS structures. As shown in FIG. 9, (100) PMOS Ion demonstrated approximately 6% or 8% improvement by asymmetric extension implants with or without eSiGe, respectively, in agreement with expectations considering about 60 ohm·um $R_{ext}$ reduction due to asymmetric extensions shown in FIG. 7.

Figure 8:
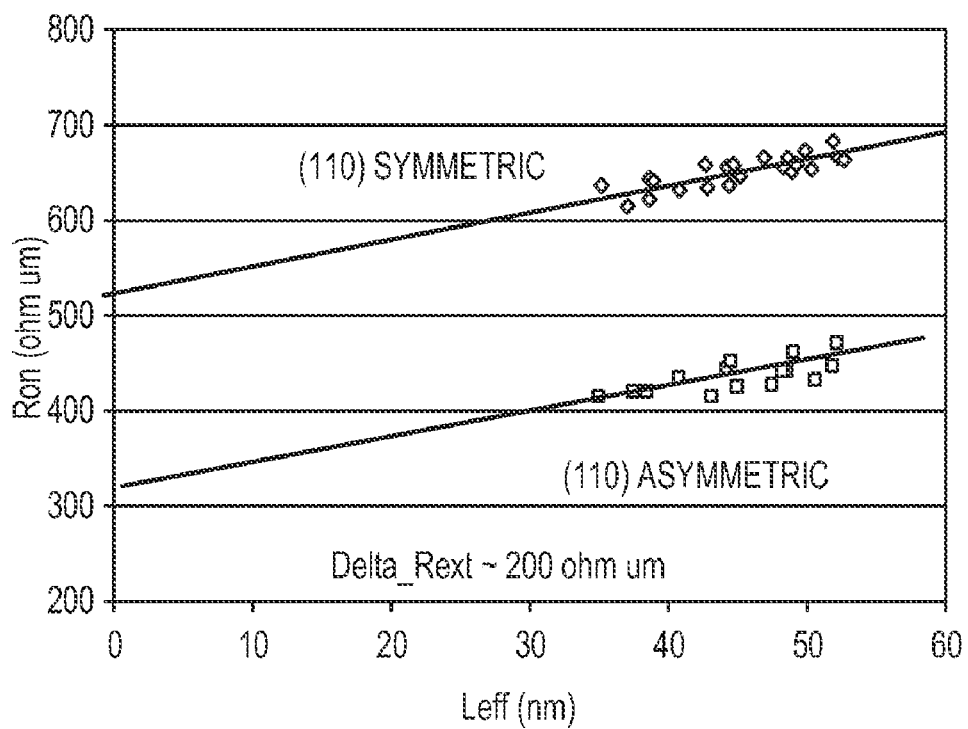
FIG. 8 is a plot of empirical results showing $R_{on}$ vs. $L_{eff}$ for exemplary (110) PMOS devices with either symmetric or asymmetric extension.
Figure 10:
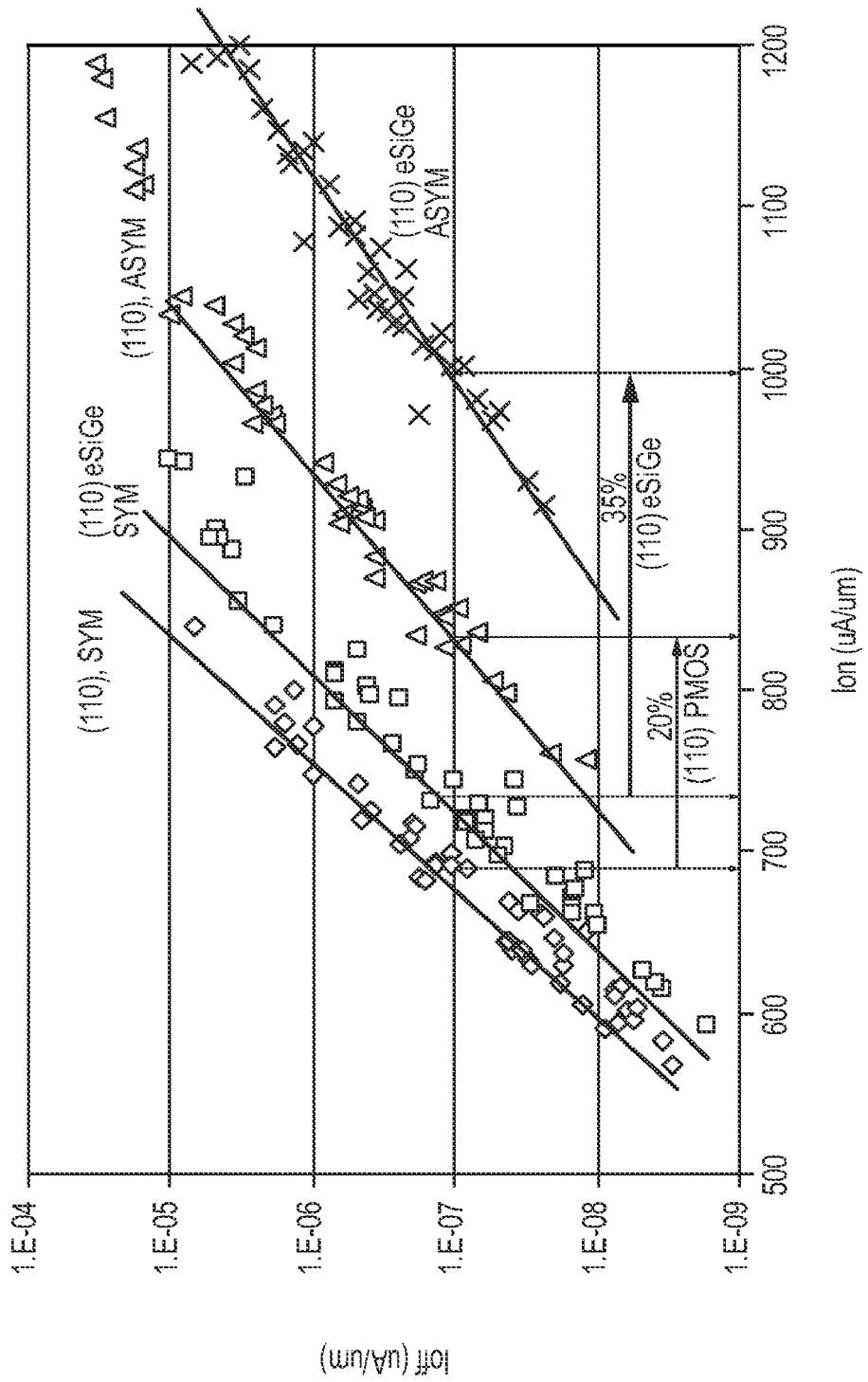
FIG. 10 is a $I_{off}$ vs. $I_{on}$ plot of empirical results showing the effect of asymmetrical extension implant on (110) pMOS with or without eSiGe.

Similarly, FIG. 8 and FIG. 10 are plots of empirical results showing the effect of asymmetrical extension implant on (110) PMOS structures. As shown in FIG. 10, (110) PMOS demonstrated 20%-35% Ion benefit from the asymmetric extension implant, substantially higher than that for (100) pMOS (c.f., 6%-8% Ion improvement asymmetric extension implants for (100) pMOS). The substantially larger Ion gain for (110) pMOS by asymmetric extension implants is in agreement with the over 200 ohm·um (110) pMOS $R_{ext}$ reduction due to asymmetric extensions shown in FIG. 8.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A MOSFET comprising:
   a semiconductor substrate having a substrate surface characterized by a (110) surface orientation;
   a gate structure formed on the substrate surface;
   a first spacer adjacent to the gate structure;
   a second spacer adjacent to the gate structure;
   a source extension and a drain extension formed in the semiconductor substrate;
   wherein at least one of the gate structure, the first spacer, and the second spacer form an ion-implantation mask defining a non-zero tilt angle with respect to an axis perpendicular to the substrate surface such that the source extension and the drain extension are asymmetrically positioned with respect to the gate structure, the non-zero tilt angle being between approximately 10 and 15 degrees.

2. The MOSFET of claim 1, wherein the source extension and the drain extension each comprise p-type material.

3. The MOSFET of claim 1, wherein the substrate comprises a semiconductor-on-insulator (SOI) layer formed on a buried oxide (BOX) layer.

4. The MOSFET of claim 1, wherein the semiconductor substrate comprises an embedded SiGe structure.

5. The MOSFET of claim 1, wherein the source extension and the drain extension are positioned laterally by an asymmetry measure determined in part by a height at least one of the first spacer and the second spacer.

6. The MOSFET of claim 1, wherein the source extension and the drain extension are positioned laterally by an asymmetry measure of between about 10 nm and about 20 nm with respect to the gate structure.

7. The MOSFET of claim 1, wherein the height of the gate structure is between about 90 and 110 nm.

8. The MOSFET of claim 1, wherein the ion-implantation mask is defined by the gate structure, the first spacer, and the second spacer, and wherein the source extension and the drain extension are positioned laterally by an asymmetry measure determined by the height of the gate structure, the first spacer, and the second spacer.

9. The MOSFET of claim 1, wherein the substrate comprises a semiconductor-on-insulator (SOI) layer formed on a buried oxide (BOX) layer, and wherein the source extension and the drain extension each comprise p-type material.

10. An integrated circuit device comprising:
    a plurality of MOSFETs, each MOSFET comprising:
        a semiconductor substrate having a substrate surface characterized by a (110) surface orientation;
        a gate structure formed on the substrate surface;
        a first spacer adjacent to the gate structure;
        a second spacer adjacent to the gate structure;
        a source extension and a drain extension formed in the semiconductor substrate;
        wherein at least one of the gate structure, the first spacer, and the second spacer form an ion-implantation mask defining a non-zero tilt angle with respect to an axis perpendicular to the substrate surface such that the source extension and the drain extension are asymmetrically positioned with respect to the gate structure, the non-zero tilt angle being between approximately 10 and 15 degrees.

11. The integrated circuit device of claim 10, wherein the source extension and the drain extension for each MOSFET comprises p-type material.

12. The integrated circuit device of claim 10, wherein the substrate for each MOSFET comprises a semiconductor-on-insulator (SOI) layer formed on a buried oxide (BOX) layer.

13. The integrated circuit device of claim 10, wherein the semiconductor substrate for each MOSFET comprises an embedded SiGe structure.

14. The integrated circuit device of claim 10, wherein the source extension and the drain extension for each MOSFET are positioned laterally by an asymmetry measure determined in part by a height at least one of the first spacer and the second spacer.

15. The integrated circuit device of claim 10, wherein the source extension and the drain extension for each MOSFET are positioned laterally by an asymmetry measure of between about 10 nm and about 20 nm with respect to the gate structure.

16. The integrated circuit device of claim 10, wherein the height of the gate structure for each MOSFET is between about 90 and 110 nm.

17. The integrated circuit device of claim 10, wherein the ion-implantation mask for each MOSFET is defined by the gate structure, the first spacer, and the second spacer, and wherein the source extension and the drain extension are positioned laterally by an asymmetry measure determined by the height of the gate structure, the first spacer, and the second spacer.

18. The integrated circuit device of claim 10, wherein the substrate for each MOSFET comprises a semiconductor-on-insulator (SOI) layer formed on a buried oxide (BOX) layer, and wherein the source extension and the drain extension each comprise p-type material.

19. A MOSFET device comprising:
a semiconductor substrate comprising an embedded SiGe structure and having a (110) surface orientation;
a gate electrode formed over the semiconductor substrate;
a first spacer adjacent to the gate structure;
a second spacer adjacent to the gate structure; and
a source extension and a drain extension formed in the semiconductor substrate;
wherein the gate structure, the first spacer, and the second spacer form an ion-implantation mask defining a non-zero tilt angle with respect to a surface of the gate structure such that the source extension and the drain extension are asymmetrically positioned with respect to the gate structure, the non-zero tilt angle being between approximately 10 and 15 degrees; and
wherein the source extension and the drain extension are positioned laterally by an asymmetry measure of between about 10 nm and about 20 nm with respect to the gate structure.

20. The MOSFET device of claim 19, wherein the first spacer is a sidewall spacer, and the second spacer is a re-oxidation spacer.

* * * * *